United States Patent
Divakaruni et al.

[11] Patent Number: 6,150,212
[45] Date of Patent: Nov. 21, 2000

[54] SHALLOW TRENCH ISOLATION METHOD UTILIZING COMBINATION OF SPACER AND FILL

[75] Inventors: Ramachandra Divakaruni, Middletown, N.Y.; Jeffrey P. Gambino, Westford, Vt.; Jack A. Mandelman, Stormville; Carl J. Radens, LaGrangeville, both of N.Y.; William R. Tonti, Essex Junction, Vt.

[73] Assignee: International Business Machines Corporation, Armonk, N.Y.

[21] Appl. No.: 09/359,287

[22] Filed: Jul. 22, 1999

[51] Int. Cl.⁷ .............................................. H01L 21/8242
[52] U.S. Cl. ........................... 438/244; 438/400; 438/427
[58] Field of Search .................................. 438/427, 424, 438/541, 222, 244; 257/301, 296

[56] References Cited

U.S. PATENT DOCUMENTS

| | | | |
|---|---|---|---|
| 5,895,253 | 4/1999 | Akram | 438/424 |
| 5,939,333 | 8/1999 | Hurley et al. | 438/241 |
| 5,945,704 | 8/1999 | Schrems et al. | 257/301 |
| 5,994,209 | 11/1999 | Yieh et al. | 438/541 |

*Primary Examiner*—Matthew Smith
*Assistant Examiner*—Calvin Lee
*Attorney, Agent, or Firm*—McGinn & Gibb, P.C.; Daryl K. Neff, Esq.

[57] ABSTRACT

A method for forming an isolation trench region in a semiconductor substrate includes providing the trench region in the semiconductor substrate, adding spacer material at least to sidewalls of the trench region, and etching the trench region at a bottom surface thereof to extend the trench region below the bottom surface and form a crevice region. The spacer material may be subsequently heated such that the spacer material flows from the sidewalls and into the crevice region.

29 Claims, 4 Drawing Sheets

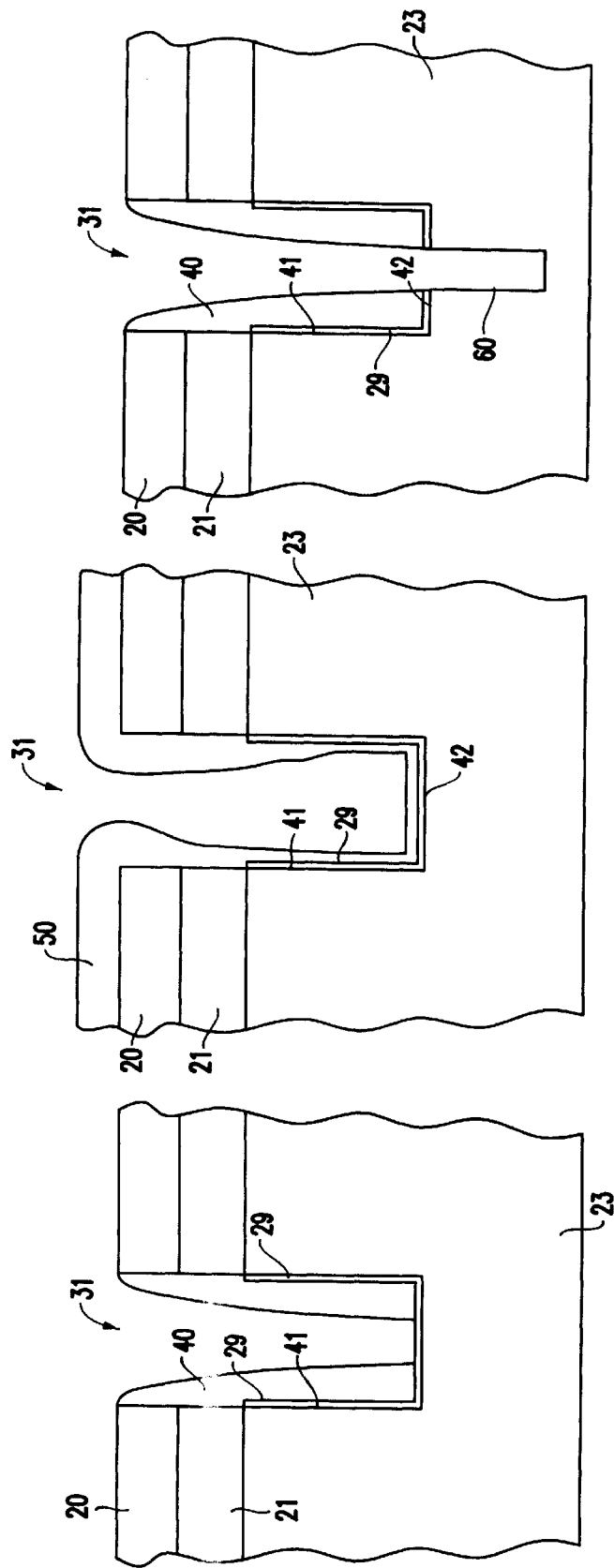

SHALLOW TRENCH ISOLATION METHOD UTILIZING COMBINATION OF SPACER AND FILL

BACKGROUND OF THE INVENTION

1. Field of the Invention

The present invention generally relates to a method of forming a shallow trench isolation (STI) region using a spacer material which also acts as a filler material.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. However, recent advances in technology have required deeper isolation regions driven by vertical transistors in DRAMs. Conventional methods have only allowed the shallow trench regions to reach depths of approximately 2500 Å because it is not only difficult to etch a deep isolation with a resist mask but it is also difficult to fill it with oxide. There is therefore a desire for a method of forming deeper trench isolation regions.

It is noted that the longer the channel length of the vertical transistor transfer device, the lower the off-state leakage. This drives deeper isolation regions between the devices. It is well known in the art that deep trenches in the silicon may be etched with an oxide hardmask on top of the pad nitride (SiN). Further, recent advances with high density plasma (HDP) oxide fill allows oxide fill of isolation depths of about 4000 Å. Thus, these deeper isolations require new and improved methods of fill.

SUMMARY OF THE INVENTION

It is, therefore, an object of the present invention to provide a method for forming a shallow trench isolation region having a high aspect ratio and allowing the isolation regions to reach depths greater than 4000 Å.

It is another object of the present invention to provide a method of forming an isolation trench region in a semiconductor substrate. The trench region may extend to a bottom surface of the trench region. Spacer material may be added to sidewalls of the trench region. The trench region may be etched at the bottom surface to form a crevice region below the bottom surface.

A thin insulation layer may be formed in the crevice region of the trench region. The insulation layer may be formed by nitridizing the substrate.

The spacer material may be heated such that the spacer material flows from the sidewalls into the crevice region. The spacer material may be a doped glass material such as PSG, BSG, BPSG, ASG or any such flowable glass material. Additional insulating material may be added over the spacer material to fill the trench region.

A spacer material may be used in the trench region and acts as a spacer during an etching process of the trench region. The spacer material may flow subsequently into a deeper etched portion of the trench region when heated above a certain temperature.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein:

FIG. 3 shows spacers added to the trench region in accordance with the present invention;

FIG. 4 shows another embodiment of spacers added to the trench region in accordance with the present invention;

FIG. 5 shows a crevice region etched deeper into the substrate in accordance with the present invention;

DETAILED DESCRIPTION OF PREFERRED EMBODIMENTS OF THE INVENTION

Figure 1:
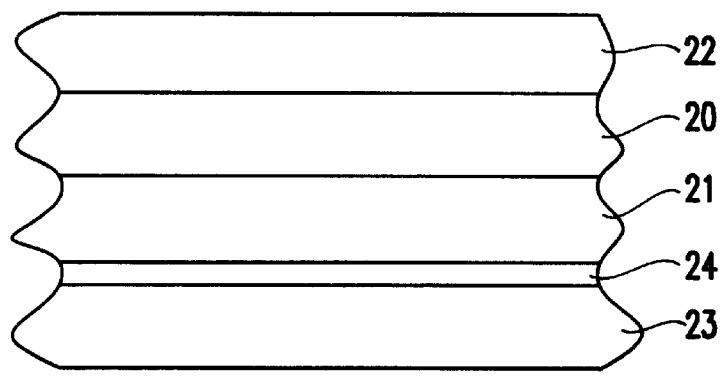
FIG. 1 is a semiconductor structure for forming a shallow trench isolation region.

FIG. 1 shows an initial semiconductor structure for forming a shallow trench isolation region in accordance with the present invention. A pad oxide layer 24 and a pad silicon nitride (SiN) layer 21 are formed on a silicon substrate 23 using conventional methods. In regions where deep trench capacitor regions do not exist, a densified tetraethylorthosilicate (TEOS) layer 20 is formed optionally on the pad silicon nitride layer 21. This structure is covered with an insulating boron silicate glass (BSG) hardmask layer 22 before any active area lithography. One skilled in the art would understand that the above mentioned layers are illustrative only and are not meant to limit the scope of the invention. Further, the semiconductor structure may include additional layers not mentioned.

Figure 2:
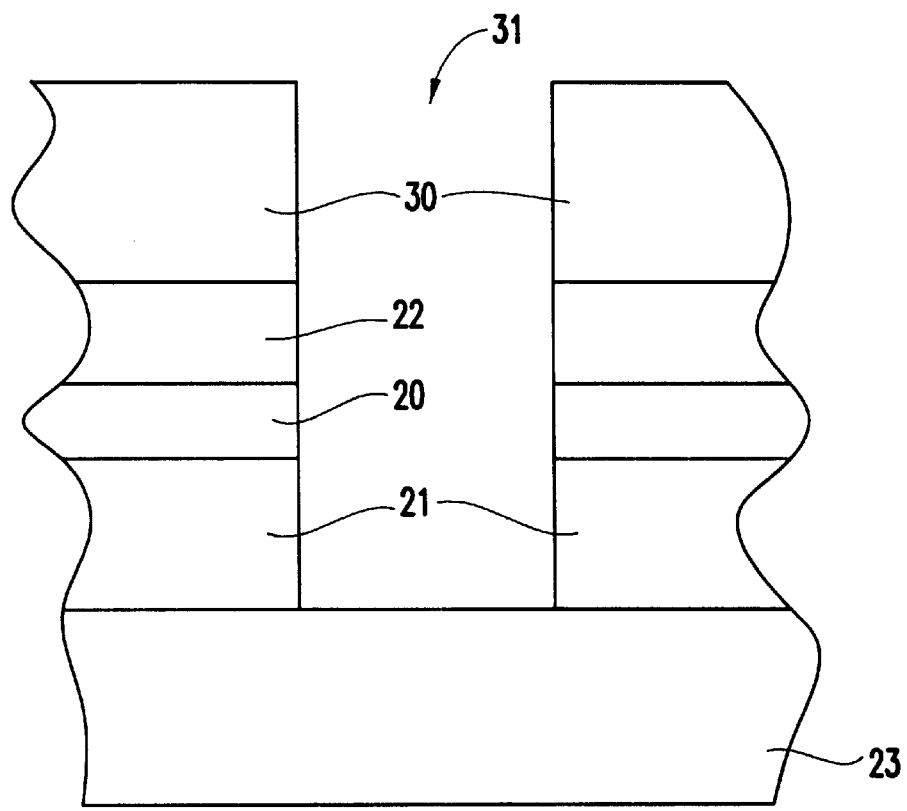
FIG. 2 shows a trench region formed in the semiconductor structure.

FIG. 2 shows a conventional photoresist 30 placed on the BSG hardmask layer 22. The photoresist 30 defines the active area and the isolation trench region 31 when the BSG hardmask layer 22, the TEOS layer 20 and the pad silicon nitride layer 21 are etched in a conventional manner. Normally the trench region 31 is delineated by 1) applying a thin coat of the photoresist 30, 2) exposing selected regions of the photoresist 30 to light in order to induce a chemical change in the photoresist 30, and 3) removing the exposed portions of the photoresist 30 by wet-chemical means. Then the exposed regions are removed to a desired depth using an anisotropic subtractive etch process. Conventional and appropriate subtractive etch methods include reactive ion etching (RIE), which is also known as plasma etching or dry etching. Such an etch process normally exhibits high uniformity, high selectivity to the photoresist or other masking material, and high directionality (anisotropy).

FIG. 3 shows the silicon substrate 23 etched to the requisite depth (preferably between 100 nm and 700 nm)

and the BSG hardmask layer 22 stripped off the wafer using known etchants such as hydrofluoric (HF) vapor or HF/sulphuric wet etchant. Borophosphosilicate glass (BPSG) or other flowable glass (such as PSG, BSG or ASG) is then deposited in the trench region 31 and etched with an anisotropic RIE etch to form spacers 40 along the sidewalls 41. Plasma enhanced BPSG process allows for a thick planar film while allowing a thinner film on the sidewalls 41 of the trench region 31. The thinner film on the sidewalls 41 allows more space for etchants in subsequent steps. Doped glass may be flowed in a subsequent step. After the isolation etch and after the BSG hardmask layer 22 is stripped, the silicon may be nitridized with rapid thermal nitridation 29 (RTN) to prevent autodoping from the subsequent deposition of doped glass (e.g. BPSG).

FIG. 4 shows an embodiment in which the BPSG spacer material 50 is deposited by plasma-enhanced chemical vapor deposition (PECVD) prior to etching. In this embodiment, the BPSG spacer material 50 covers the sidewalls 41 and the bottom surface 42 of the trench region 31 as well as the top surface of the TEOS layer 20. In FIG. 4, since there is a thicker BPSG layer on top of the structure, a deeper crevice may be etched in subsequent steps.

Then, as shown in FIG. 5, with the spacers 40 along the sidewalls 41 of the trench region 31, the silicon substrate 23 is further etched preferably for an additional 50 nm to 500 nm to form a crevice region 60. Because of the width of the spacers 40 along the sidewalls 41, the width of the crevice region 60 is narrower than the width of the trench region 31 above the crevice region 60. This additional etching area of the crevice region 60 may continue as long as the pad nitride layer 21 is not exposed. This further etching allows for a significantly deeper isolation for vertical transistor isolation as in advanced DRAM cells. The deep isolation isolates different silicon islands. The larger silicon volume at the isolation bottom allows larger silicon volume for the buried strap depletion.

While FIG. 5 shows the etching of the silicon substrate 23 when the spacers 40 of the FIG. 3 embodiment are used, one skilled in the art would understand that similar etching into the silicon substrate 23 could also occur if the spacers 50 of the FIG. 4 embodiment were used. Deeper crevices may be etched in the FIG. 4 embodiment since the BPSG is thinner at the bottom during the spacer RIE step.

Then, a low temperature nitride (or oxide) layer 70 is grown along the exposed silicon surface 71 within the crevice region 60. The nitride layer 70 is grown preferably at a temperature less than about 700° C. in order to prevent any flow of the BPSG material forming the spacers 40. The nitride layer 70 is grown by rapid thermal nitridation (RTN) and is needed to prevent doping of the exposed silicon in the crevice region 60.

Figure 6A:
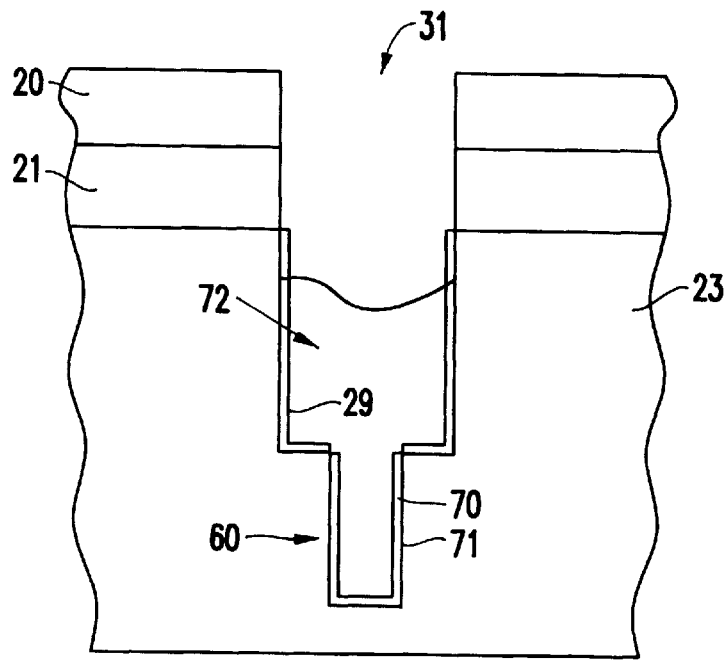
FIG. 6A shows the spacer material filling portions of the trench region in accordance with the present invention.
Figure 6B:
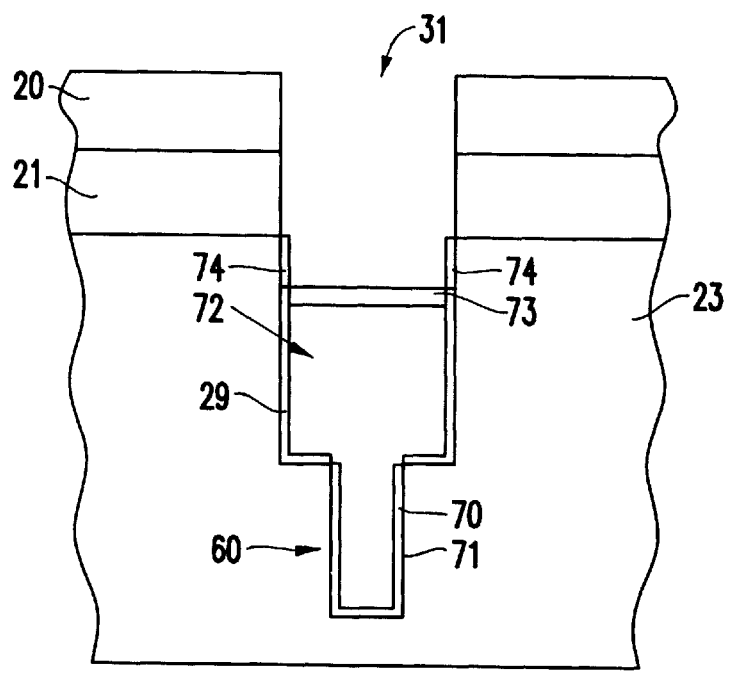
FIG. 6B shows the spacer material filling portions of the trench region and an HDP oxide layer in accordance with the present invention.

After the nitride layer 70 is formed within the crevice region 60, the structure is subjected to a temperature greater than 750° C. This higher temperature causes the BPSG material forming the spacers 40 to flow into the crevice region 60 and partially fill up the trench region 31. FIG. 6A shows the reflowed BPSG material 72 within the trench region 31. The trench region 31 is subsequently filled (e.g., over the reflowed BPSG material 72) with conventional TEOS or HDP oxide. Alternatively, after the processing of FIG. 6A, a thin HDP oxide layer 73 may be deposited as shown in FIG. 6B. The nitride layer 29 may be cleared out from the top of the trench region 31 with a wet etch and the silicon may be oxidized conventionally in area 74 so that the trench region 31 may be filled with TEOS or HDP oxide.

Figure 7:
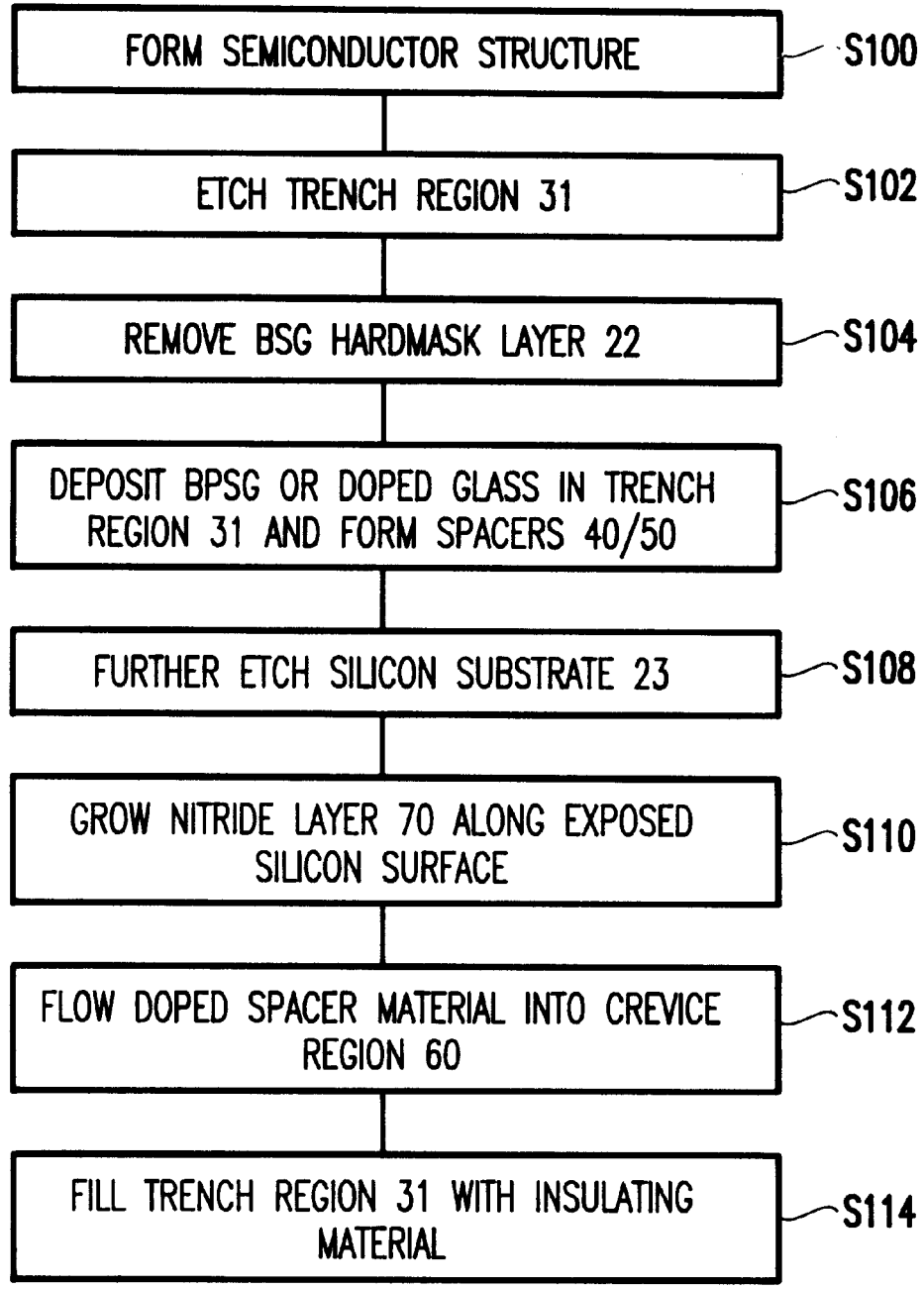
FIG. 7 is a flowchart showing steps of the present invention.

FIG. 7 shows a flowchart showing steps of the present invention. In step S100, the semiconductor substrate is formed preferably including a silicon substrate 23, a pad oxide layer 24, a pad silicon nitride layer 21, a TEOS layer 20 and a BSG layer 22. Then, in step S102, the trench region 31 is etched preferably using a photoresist 30. In step S104, the BSG hardmask layer 22 is removed and in subsequent step S106, the BPSG material is deposited in the trench region 31 and is etched to form spacers 40/50 such as shown in FIGS. 3 or 4. A nitridation of the silicon substrate 23 may be necessary before depositing spacers 40/50. Then, in step S108, the silicon substrate 23 is further etched to form a crevice region (or extended trench region) 60. Then, in step S110, a nitride layer 70 is grown along the exposed silicon surface substrate in the crevice region 60. Then, in step S112, the BPSG spacer material is flowed into the crevice region 60 preferably by heating the semiconductor structure at a high temperature. Finally, in step S114, the trench region 31 is filled with an insulating material such as a high density plasma oxide or TEOS to complete the isolation separation of the trench region 31. The trench region 31 may be appropriately polished using chemical mechanical polishing as is well known to one skilled in the art. Using the above described steps, an isolation region is formed that extends deeper into the silicon substrate 23.

The present invention provides several key features and advantages which have not been utilized or recognized before. By using a BPSG spacer material within the trench region, isolation regions may be formed deeper than 7000 Å. This is particularly important in advanced DRAM cells because of vertical gate transfer devices. Further, the BPSG material flows at a high temperature and acts like an oxide at a lower temperature. This makes it advantageous to be used as a spacer material during the etching process and as a filler material within the trench region following the formation of the crevice region 60. This also prevents gap fill problems in the deeper STI portions.

In addition to filling deep trenches for isolation, the present invention is useful for isolation before deep trench silicon etches for capacitors in a DRAM. This invention is also useful for providing additional silicon deep in the substrate that can prevent pinch-off of the silicon from the buried strap of a vertical transistor.

This invention also provides a method to fill an isolation region with doped glass without doping the silicon. In this embodiment, the sidewalls of the trench region may be nitridized to form a nitride layer 29 prior to adding the spacer material 40/50. Then, the spacer material 40/50 may be added to fill the trench region without forming a crevice region 60. In such a case, an HDP oxide layer 73 may be added over the spacer material and the nitride layer above the HDP oxide layer 73 may be cleared out so that the silicon can be oxidized in area 74 and the trench region 31 can be filled with TEOS or HDP oxide.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method of forming an isolation trench region in a semiconductor substrate, the method comprising:

providing a trench region in said semiconductor substrate, said trench region having sidewalls extending to a bottom surface;

adding spacer material at least along said sidewalls of said trench region;

etching said trench region at said bottom surface to extend said trench region beyond said bottom surface and form a crevice region; and heating at least said spacer material such that said spacer material flows from said sidewalls and into said crevice region.

2. The method of claim 1, further comprising forming an insulation layer in said crevice region of said trench region prior to said heating.

3. The method of claim 2, wherein said insulation layer is formed by nitridizing said substrate.

4. The method of claim 1, wherein said spacer material comprises a glass material.

5. The method of claim 1, further comprising adding an insulating material to said trench region above said spacer material after said spacer material has flowed into said crevice region.

6. The method of claim 1, further comprising forming a plurality of layers including a doped glass layer over said semiconductor substrate, and wherein said trench region extends through said plurality of layers and into said semiconductor substrate.

7. The method of claim 6, further comprising removing said doped glass layer before adding said spacer material.

8. The method of claim 1, further comprising nitridizing surfaces of said substrate in said trench region to form said sidewalls prior to adding said spacer material.

9. A method of forming an isolation trench region in a substrate, the method comprising:

forming a trench region in said substrate, said trench region having walls, and extending at least from a first surface of said substrate toward a second surface of said substrate;

covering portions of said walls of said trench region with spacer material;

forming an extended area of said trench region in a direction toward said second surface of said substrate; and heating said spacer material to flow the spacer material to fill said extended area of said trench region with said spacer material previously covering portions of said walls of said trench region.

10. The method of claim 9, further comprising forming an insulation layer along walls of the extended area.

11. The method of claim 10, wherein said insulation layer is formed by nitridizing said substrate.

12. The method of claim 9, wherein said heating includes heating said spacer material such that said spacer material flows from said walls of said trench region into said extended area.

13. The method of claim 9, wherein said spacer material comprises a glass material.

14. The method of claim 9, wherein after filling said extended area, the method further comprises filling said trench region with an insulating material.

15. The method of claim 9, further comprising forming a plurality of layers including a doped glass layer over said substrate, and wherein said trench region extends through said plurality of layers and into said substrate.

16. The method of claim 15, further comprising removing said doped glass layer before covering portions of said walls of said trench region with said spacer material.

17. The method of claim 9, further comprising nitridizing surfaces of said substrate in said trench region to form said walls prior to covering portions of said walls with said spacer material.

18. A method of forming a trench region in a substrate, the method comprising:

providing a trench region in said substrate;

adding spacer material into said trench region;

extending said trench region further into said substrate so as to form a crevice region; and heating said spacer material such that the spacer material flows and enters said crevice region.

19. The method of claim 18, further comprising forming an insulation layer in said crevice region prior to heating said spacer material.

20. The method of claim 18, wherein said insulation layer is formed by nitridizing said substrate at a temperature lower than a temperature at which said spacer material enters said crevice material.

21. The method of claim 18, wherein during heating said spacer material, said spacer material flows from walls of said trench region and into said crevice region.

22. The method of claim 21, wherein after heating said spacer material, the method further comprises filling said trench region with an insulating material.

23. The method of claim 18, wherein said spacer material comprises a glass material.

24. The method of claim 18, further comprising nitridizing surfaces of said substrate in said trench region prior to adding said spacer material.

25. A method of forming an isolation trench region in a semiconductor substrate, the method comprising:

providing a trench region in said semiconductor substrate, said trench region having sidewalls;

adding a nitride layer on said sidewalls of said trench region;

adding spacer material in said trench region;

etching said trench region at a bottom surface thereof to extend said trench region beyond the bottom surface of the trench region and form a crevice region; and heating at least said spacer material such that said spacer material flows into said crevice region.

26. The method of claim 25, further comprising forming an insulation layer in said crevice region of said trench region prior to said heating.

27. The method of claim 25, further comprising removing said nitride layer from portions of said trench region not covered with said spacer material.

28. The method of claim 27, further comprising adding an oxide layer over said spacer material.

29. The method of claim 27, further comprising oxidizing said substrate at regions within said trench region not covered with said spacer material.

* * * * *